/ United States Patent | (10) Patent No.: US 11,872,603 B2
Rebstock et al. | (45) Date of Patent: Jan. 16, 2024

(54) METHOD FOR CLEANING A SYNTHETIC SURFACE

(71) Applicant: BROOKS AUTOMATION (GERMANY) GMBH, Radolfzell (DE)

(72) Inventors: Lutz Rebstock, Gaienhofen (DE); Matthias Fryda, Itzehoe (DE); Thorsten Matthée, Hohenaspe (DE)

(73) Assignee: BROOKS AUTOMATION (GERMANY) GMBH

( * ) Notice: Subject to any disclaimer, the term of this patent is extended or adjusted under 35 U.S.C. 154(b) by 212 days.

(21) Appl. No.: 16/304,836

(22) PCT Filed: May 24, 2017

(86) PCT No.: PCT/EP2017/062693
§ 371 (c)(1),
(2) Date: Dec. 12, 2018

(87) PCT Pub. No.: WO2017/203007
PCT Pub. Date: Nov. 30, 2017

(65) Prior Publication Data
US 2020/0043766 A1   Feb. 6, 2020

(30) Foreign Application Priority Data

May 27, 2016 (DE) ..................... 10 2016 109 771.3

(51) Int. Cl.
*B08B 3/08* (2006.01)
*C02F 1/461* (2023.01)
(Continued)

(52) U.S. Cl.
CPC .............. *B08B 3/08* (2013.01); *C02F 1/4618* (2013.01); *C11D 7/10* (2013.01); *C11D 7/50* (2013.01);
(Continued)

(58) Field of Classification Search
CPC ............ B08B 3/00–14; B08B 9/00–46; C02F 2201/46115; C02F 2001/46185;
(Continued)

(56) References Cited

U.S. PATENT DOCUMENTS 5,578,193 A * 11/1996 Aoki ........................ B08B 3/08
205/746
5,593,554 A * 1/1997 Yamanaka ............. B01D 61/58
204/252
(Continued)

FOREIGN PATENT DOCUMENTS

CN         1092477       8/1994
CN       102658270       9/2012
(Continued)

OTHER PUBLICATIONS

Innovative wafer carriers lined with PEEK compound, Overmolding Ensures Dimensional Stability and Low Particulate Levels, Plastic Applications Database (Knovel 2005). (Year: 2005).*
(Continued)

*Primary Examiner* — Mikhail Kornakov
*Assistant Examiner* — Richard Z. Zhang
(74) *Attorney, Agent, or Firm* — Perman & Green, LLP

(57) ABSTRACT

The invention relates to a method for cleaning a synthetic surface, in particular to remove metal dirt and/or particles therefrom, said method being characterized by the following steps: a) the synthetic surface is rinsed with deionized water; b) the synthetic surface is rinsed with electrolyzed water; and c) the synthetic surface is rinsed with deionized water.

10 Claims, 4 Drawing Sheets

Figure 1:
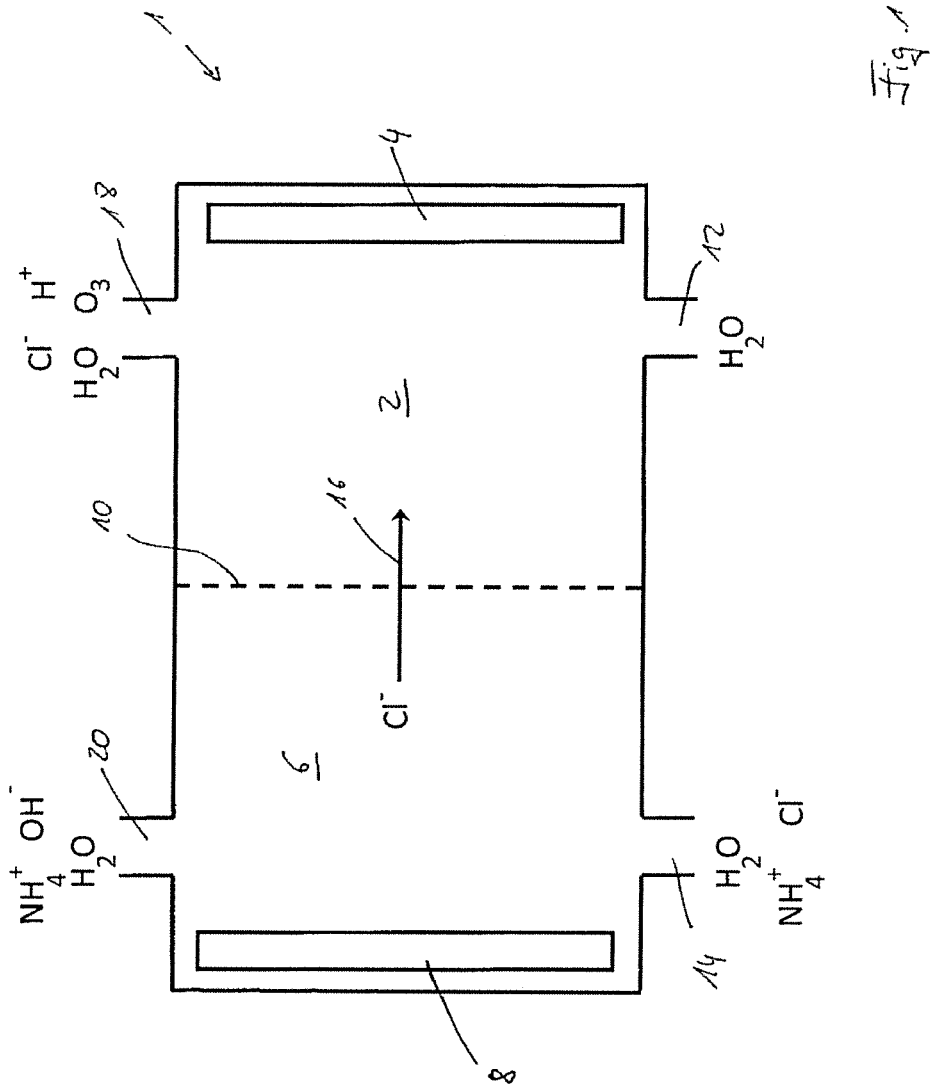

(51) Int. Cl.
*C11D 7/10* (2006.01)
*C11D 7/50* (2006.01)
*C11D 11/00* (2006.01)
*H01L 21/673* (2006.01)

(52) U.S. Cl.
CPC .... *C11D 11/0035* (2013.01); *H01L 21/67389* (2013.01); *C02F 2001/46195* (2013.01); *C02F 2201/46115* (2013.01)

(58) Field of Classification Search
CPC .... C02F 2001/4619; C02F 2001/46195; C02F 1/00–78; H01L 21/00–86; C11D 11/0047
See application file for complete search history.

(56) References Cited

U.S. PATENT DOCUMENTS

| | | | |
|---|---|---|---|
| 5,599,438 A * | 2/1997 | Shiramizu | C02F 1/36 205/746 |
| 5,635,053 A | 6/1997 | Aoki et al. | |
| 5,676,760 A | 10/1997 | Aoki et al. | |
| 5,725,753 A | 3/1998 | Harada et al. | |
| 5,762,779 A | 6/1998 | Shiramizu et al. | |
| 5,833,831 A * | 11/1998 | Kitajima | B08B 3/08 205/349 |
| 6,273,107 B1 * | 8/2001 | Adams | B08B 3/102 134/102.1 |
| 6,723,226 B1 | 4/2004 | Takayasu et al. | |
| 2002/0027084 A1 * | 3/2002 | Park | H01L 21/02071 205/464 |
| 2005/0121334 A1 | 6/2005 | Sumita | |
| 2014/0158172 A1 | 6/2014 | Hsu et al. | |
| 2015/0053239 A1 * | 2/2015 | Abe | C11D 11/0047 134/21 |

FOREIGN PATENT DOCUMENTS

| | | | |
|---|---|---|---|
| DE | 195 40 471 A1 | | 5/1996 |
| DE | 696 19 039 T2 | | 8/2002 |
| EP | 0605882 | | 7/1994 |
| JP | 6114233 | | 1/1986 |
| JP | S6114233 A | * | 1/1986 |
| JP | 08283976 | | 10/1996 |
| JP | 09070381 | | 3/1997 |
| JP | 2001156034 A | * | 6/2001 |
| JP | 2001156034 A | | 6/2001 |
| JP | 2001191076 A | * | 7/2001 |
| JP | 2002153827 A | * | 5/2002 |
| JP | 2006255603 | | 9/2006 |
| JP | 2007123770 A | | 5/2007 |
| JP | 2010155435 A | * | 7/2010 |
| KR | 20140084731 A | * | 7/2014 |
| WO | 2006/025639 A1 | | 4/2005 |
| WO | WO-2008138357 A1 * | 11/2008 | ............... A61L 9/01 |

OTHER PUBLICATIONS

OED Online, "insolvent," (Oxford University Press), retrieved from https://www.oed.com/view/Entry/96927 (Year: 2023).*
Dictionary of Chemistry, "solubility," (8th ed Oxford University Press 2020), retrieved from https://app.knovel.com/hotlink/pdf/id:kt012L4HJ1/dictionary-chemistry/sodium-formate-solubility (Year: 2020).*

* cited by examiner

METHOD FOR CLEANING A SYNTHETIC SURFACE

The invention relates to a method for cleaning, more particularly for removing metallic contaminants and/or particles from, a plastics surface.

Processors and integrated circuits are nowadays fabricated on silicon wafers in a multiplicity of different steps to be carried out one after another, in which the wafers are coated with any of a very wide variety of different materials, or are exposed to light, or parts of applied coats are removed again by various etching methods or other techniques. Between these individual steps, the partially coated wafers must be transported from one processing machine to another machine. During such transport it is of the utmost importance that the highly sensitive, very delicately coated surfaces are not damaged. In particular, applied electrical conductor tracks must remain electrically separate from one another so as to ensure the functionality of the component being fabricated—a processor, for example.

For storage and for transport, the partially coated wafers are stored in what are called FOUPs (Front Opening Unified Pods). These pods consist of a plastic, for example polycarbonate or polyetheretherketone (PEEK). During insertion of the coated silicon wafers, it is possible for material to adhere to the plastic of the container and so lead to contamination. If a different wafer is stored in the container in a subsequent step, it is possible for metallic contaminants and/or particles attached in this way to be transferred to the new coated wafer and so be responsible, for example, for short circuits of electrical lines or other damage. Such contaminants may therefore result in considerable losses and in components which are functionally incapacitated. It is therefore necessary for the plastics surfaces to be cleaned in order to prevent contamination of the silicon wafers. Corresponding cleaning methods are of course also suitable for other use examples where the intention is to clean plastics surfaces and, in particular, free them from metallic contaminants.

The plastics containers in which the silicon wafers are stored and transported are nowadays treated primarily with deionized water, also referred to as distilled water. Because, in particular, of the advancing miniaturization of the coatings and of the integrated circuit structures produced, however, such treatment is often no longer sufficient, since even small and tiny contaminations lead to misfunctions of the integrated circuits, which are therefore rejects and cannot be used. The object on which the invention is based, therefore, is that of developing a method for cleaning plastics surfaces in such a way that it is simple, inexpensive, and rapid to carry out and that the cleaning effect particularly for metallic contaminants is improved.

The invention achieves the stated object by means of a method for cleaning, more particularly for removing metallic contaminants and/or particles from, a plastics surface, the method comprising the following steps:
 a) rinsing the plastics surface with deionized water,
 b) rinsing the plastics surface with electrolyzed water and
 c) rinsing the plastics surface with deionized water.

The term "rinsing" in the sense of the present invention means that the liquid in question is applied to the plastics surface that is to be cleaned. This may be done, for example, by spraying the respective liquid onto the surface, or immersing the plastics surface into the respective liquid. It is of course also possible to cause the liquid to trickle over the plastics surface.

In a first step of the method, therefore, the plastics surface to be cleaned is rinsed with deionized water, also referred to as distilled water. Initially, therefore, coarse particles lying on or adhering to the surface are removed. With particular advantage the ionized water is sprayed onto the plastics surface to be cleaned.

In a second step of the method, the plastics surface is rinsed with electrolyzed water. Electrolyzed water is produced by adding an electrolyte to deionized water and then passing it through an electrolysis cell, for example. As a result of the use of electrolyzed water, at least part of the metal adhering to the plastics surface is dissolved and in this way removed from the surface. With preference the adhering metal is removed completely.

To remove residues of the electrolyzed water on the plastics surface to be cleaned, in particular, the surface is rinsed again with deionized water, in a third step of the method. Used advantageously for this purpose is what is called a "rinse cleaning process", in which the deionized water trickles over the surface to be cleaned.

In comparison to the methods known from the prior art, in which the cleaning is accomplished exclusively using deionized water, the method of the invention makes use of the finding that the solubility of metals in water is dependent in particular on the pH and the redox potential of the water. Generally speaking, therefore, the solubility of metals in electrolyzed water is higher than in deionized water, and so the additional method step of rinsing with electrolyzed water allows metallic contaminants to be removed more effectively than on cleaning with deionized water alone.

The rinsing with electrolyzed water advantageously comprises rinsing with anodic water having a pH of less than 7. Anodic water is therefore acidic and is able to dissolve a series of metals.

Alternatively or additionally, the rinsing with electrolyzed water comprises rinsing with cathodic water which has a pH of more than 7. In particular, particles—metallic particles for example—can preferably be removed at least to a very large extent, but preferably completely, with cathodic water.

It has emerged as being advantageous if the rinsing with electrolyzed water comprises the rinsing both with anodic water and with cathodic water, the two differently electrolyzed waters being used in succession. The plastics surface is advantageously rinsed first with anodic water, before it is rinsed with cathodic water.

The rinsing of the plastics surface with anodic water may cause slight positive charges to be left on the surface. As a result, later renewed adhesion of particles is facilitated and the adhesion is improved, and so these remaining slightly positive charges ought to be avoided. By means of a later alkaline aftertreatment of the surface through the rinsing with cathodic water, these slightly positive charges are removed, thereby hindering the adhesion of new particles.

Irrespective of which electrolyzed water is used for rinsing, deionized water is used for rinsing at the end, in order as far as possible to remove completely the residues of the electrolyzed water.

The electrolyzed water is produced advantageously in an electrolysis cell which comprises two electrodes and into which water admixed with an electrolyte is introduced. The production of electrolyzed water has long been known from the prior art. Advantageously, however, the pH and/or the redox potential of the electrolyzed water can be adjusted by using the concentration of the electrolyte and/or an electrical current flowing between the two electrodes as control parameter(s). The electrolysis cell generally possesses two electrolysis chambers, of which one is the cathode chamber with the cathode located therein and the other is the anode chamber with the anode located therein. The two electrodes are preferably in the form of diamond electrodes. Deionized water admixed with an electrolyte is introduced into at least one of the two chambers, and is therefore exposed to the electrical field prevailing between the two electrodes. The two chambers are separated from one another by a membrane which is permeable to ions of a certain charge. Thus there are, for example, membranes permeable to anions and membranes permeable to cations, which can be used, accordingly, to control which type of ions are able to cross the membrane.

Through the selection of the particular electrolyte and the particular concentration of the electrolyte, it is possible to adjust the pH of the electrolyzed water under production to a predetermined value. For this purpose it may be necessary to adjust and adapt the residence time of the deionized water with electrolyte within the respective chamber of the electrolysis cell, in other words the flow rate, and/or the current which flows through the two electrodes. By means of the electrical current, moreover, it is also possible to adjust the redox potential of the electrolyzed water produced. It is possible consequently for both the pH and the redox potential to be adjusted to a desired combination of values independently of one another, at least within predetermined ranges, and therefore to adjust the electrolyzed water in a manner ideally suited to the metal to be dissolved that adheres as a contaminant on the plastics surface to be cleaned.

It is possible in particular to select electrolytes which form chloride ions ($Cl^-$), fluoride ions ($F^-$), sulfate ions ($SO_4^{2-}$), phosphate ions ($PO_4^{3-}$), nitrate ions ($NO_3^-$) or combinations of these ions. Of course, electrolytes which form cations must also be used, in order to ensure electrical neutrality. Suitable cations include, in particular, hydrogen ions ($H^+$) and/or ammonium ions ($NH4^+$).

This is simple, quick, and reliable to achieve, and so the method can be carried out inexpensively.

The rinsing of the plastics surface in each of the method steps lasts between 5 seconds and 600 seconds and advantageously between 15 seconds and 90 seconds. If rinsing in method step b) is carried out both with anodic and with cathodic water, a rinsing duration of between 15 seconds and 90 seconds may be provided for each of these two rinses. It has emerged as being advantageous if the rinsing in the various method steps lasts for different durations. The respective rinsing duration is preferably adjusted for the anticipated soiling or contaminants and for the desired degree of cleaning.

In order further to improve the rinsing and cleaning effect, the temperature of the deionized water and/or of the electrolyzed water may be between 10° C. and 70° C. It has emerged in this context that the cleaning effect increases as the temperature rises. Here as well, of course, the temperature in different method steps may be selected differently for the particular liquid. In particular, the deionized water used for rinsing in method step a) may also have a different temperature, and more particularly may be hotter or colder, than the deionized water used for rinsing in method step c).

The invention achieves the stated object, moreover, by means of an apparatus for carrying out a method described here. Such an apparatus preferably not only possesses the possibility for rinsing the plastics surface with the different liquids, but also encompasses an electrolysis cell in order to produce the required electrolyzed water itself. In that case the electrolysis cell can be operated continuously in permanent operation.

Alternatively to this, a time-limited operation of the electrolysis cell may also be expedient if the apparatus, for example, possesses one or more intermediate tanks or storage facilities in which the electrolyzed liquid can be stored temporarily. In that case it is possible to use an electrolysis cell with a greater capacity, which may possibly be operated more efficiently.

With the aid of the appended drawings, an exemplary embodiment of the present invention is elucidated in more detail below. In the drawing, FIG. 1—shows the schematic representation of an electrolysis cell, FIG. 2—shows the schematic representation of a construction of an apparatus according to a first exemplary embodiment of the present invention, and FIGS. 3 and 4—show schematic diagrams indicating the cleaning effect.

FIG. 1 shows an electrolysis cell 1 having an anode chamber 2, in which there is an anode 4, and a cathode chamber 6, in which there is a cathode 8. Between the anode chamber 2 and the cathode chamber 6 there is an ion exchange membrane 10, which in the exemplary embodiment shown takes the form of an anion exchange membrane 10. Through an anode chamber feed 12, deionized water or distilled water, which may also be very pure or ultrapure water, is introduced into the anode chamber 2. At the same time, deionized water containing an electrolyte, which in the exemplary embodiment shown forms chloride ions, is passed into the cathode chamber 6 through a cathode chamber feed 14. It is shown diagrammatically in FIG. 1 that in the cathode chamber 6, in addition to the water ($H_2O$), there are also ammonium ions ($NH_4^+$) and chloride ions ($Cl^-$).

Between the anode 4 and the cathode 8 an electrical voltage is applied which accelerates the chloride ions ($Cl^-$) along the arrow 16 in the direction of the anode 4. They are able to pass through the ion exchange membrane 10, and are then within the anode chamber 2.

In an alternative embodiment, instead of an anion exchange membrane, it is also possible to use a cation exchange membrane, so that positively charged cations can pass from the anode chamber 2 into the cathode chamber 6.

Through an anode chamber drain 18, the constituents shown in FIG. 1 leave the anode chamber 2. These constituents are water, chloride ions ($Cl^-$), and hydronium ions ($H^+$), which are generated by the electrical voltage between the anode 4 and the cathode 8. At the same time, in the anode chamber 2, ozone ($O_3$) is formed, and likewise leaves the anode chamber 2 through the anode chamber drain 18.

From an anode chamber drain 20, not only the water but also the ammonium ions ($NH_4^+$) and also the hydroxide ions ($OH^-$) leave the cathode chamber 8.

From the concentration of the electrolyte from which the chloride ions ($Cl^-$) are formed in the example shown, and from the electrical current brought about by the voltage applied between the anode 4 and the cathode 8, it is possible to adjust the pH and also the redox potential of the electrolyzed water emerging from the anode chamber drain 18.

Figure 2:
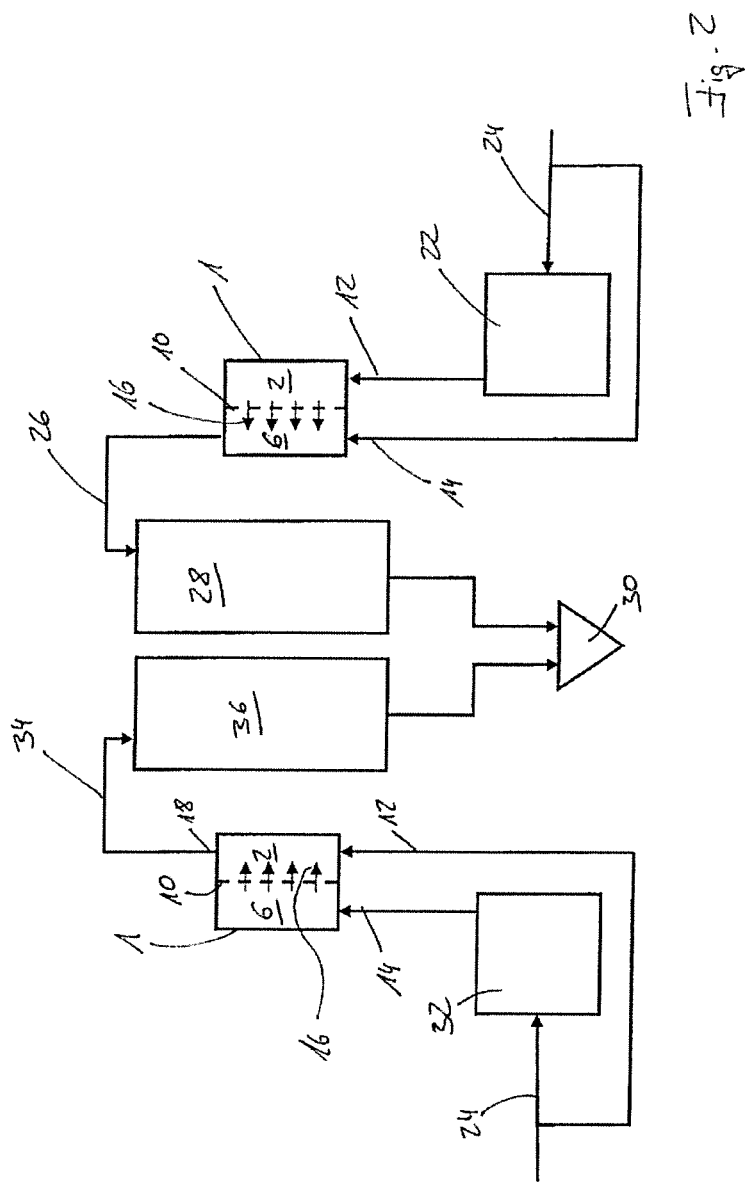

FIG. 2 shows, schematically, an apparatus for carrying out a method for cleaning according to a first exemplary embodiment of the present invention.

The apparatus possesses two electrolysis cells 1, each having an anode chamber 2 and a cathode chamber 6. Disposed between the two chambers in each case is an ion exchange membrane 10, which in the electrolysis cell 1 shown on the left in FIG. 2 takes the form of an anion exchange membrane, and in the electrolysis cell 1 shown on the right takes the form of a cation exchange membrane. In accordance with the arrows 16, therefore, anions in the left-hand electrolysis cell 1 are able to pass through the ion exchange membrane 10, whereas cations in the right-hand electrolysis cell 1 are able to cross from the anode chamber 2 into the cathode chamber 6.

The apparatus shown in FIG. 1 possesses an anolyte mixing tank 22. In this tank, deionized water, provided via a supply line 24, is mixed with an anolyte, before being fed via the anode chamber feed 12 into the anode chamber 2 of the electrolysis cell 1 shown on the right in FIG. 2. Deionized water is supplied through the cathode chamber feed 14.

Cathodic water is produced in the electrolysis cell shown on the right in FIG. 2, and is introduced via a cathode line 26 into a cathode tank 28. From there it can be supplied to an applicator 30 by which it is applied to a plastics surface to be cleaned.

The apparatus shown in FIG. 2, moreover, possesses a catholyte mixing tank 32. In this tank, deionized water supplied via the supply line 24 is mixed with a catholyte, before being introduced via the cathode chamber feed 14 into the cathode chamber 6. Deionized water is introduced via the anode chamber feed 12 into the anode chamber 2 of the electrolysis cell 1 shown on the left in FIG. 2. From the anode chamber drain 18, the anodic water produced in the left-hand electrolysis cell is introduced through an anode line 34 into an anode tank 36, from which it may likewise be supplied to the applicator 30.

Figure 3:
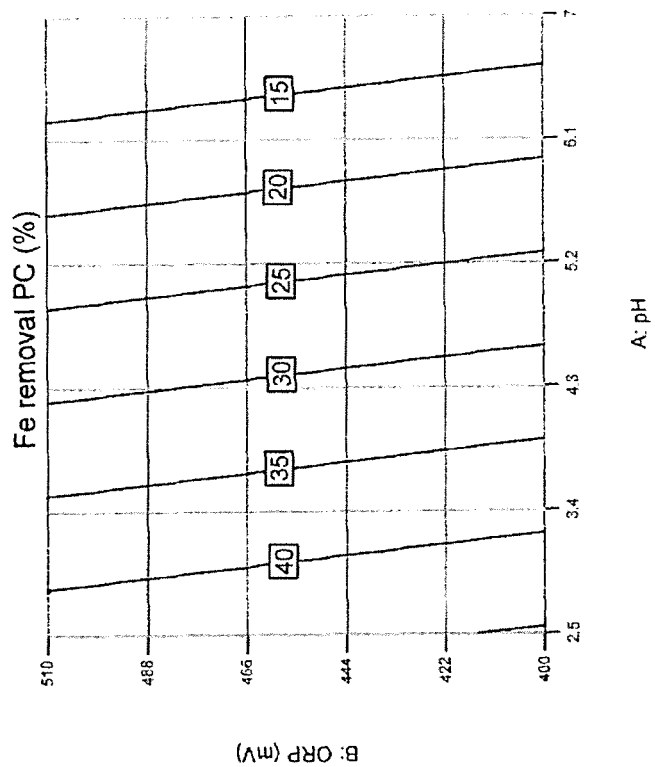
Figure 4:
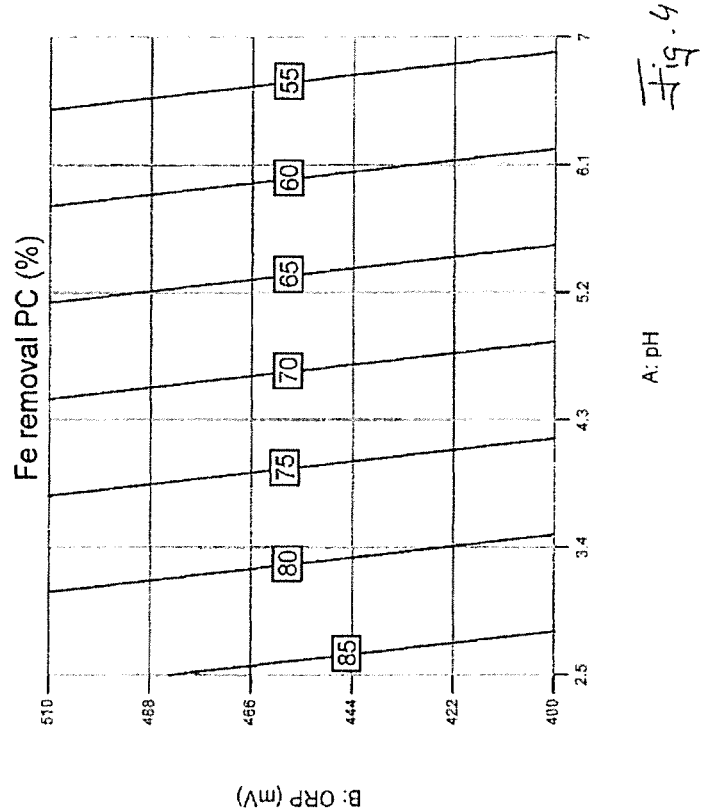

FIGS. 3 and 4 show schematically the cleaning effect of a method according to one exemplary embodiment of the present invention. The task in this case is the removal of iron contaminants from a component made of polycarbonate. What is plotted in each case is B, the redox potential in millivolts (mV), against A, the pH. The solid lines each contain a number in a rectangular box. This number denotes the percentage fraction of the iron contaminants which it has been possible to remove using the respective method. For example, in the case of the result shown in FIG. 3 for a method, 25% of the iron contaminants are removed, at a pH of 5.2 and a redox potential of 422 mV.

In the case of the method whose result is shown in FIG. 3, the surface is treated with the respective liquid for 15 seconds at a temperature of 22.1° C., whereas for the method whose result is shown in FIG. 4, the treatment occurs with the respective liquid for 180 seconds at a temperature of 70° C. It can be seen that with identical ranges of the redox potential B and of the pH A, the longer exposure time to the respective liquid allowed significantly greater proportions of the iron soiling and contaminants to be removed.

LIST OF REFERENCE SYMBOLS

1 Electrolysis cell
2 Anode chamber
4 Anode
6 Cathode chamber
8 Cathode
10 Ion exchange membrane
12 Anode chamber feed
14 Cathode chamber feed
16 Arrow
18 Anode chamber drain
20 Cathode chamber drain
22 Anolyte mixing tank
24 Supply line
26 Cathode line
28 Cathode tank
30 Applicator
32 Catholyte mixing tank
34 Anode line
36 Anode tank

The invention claimed is:

1. A method for cleaning a plastic's surface so as to effect removing metallic particulate contaminants from the plastic's surface, comprising:
  a) rinsing the plastic's surface with deionized water, then
  b) rinsing the plastic's surface with electrolyzed water, wherein the plastic's surface is rinsed with anodic water followed by cathodic water so as to remove positive charges left on the plastic's surface by the anodic water, and then
  c) rinsing the plastic's surface with deionized water;
  wherein the rinsing of the plastic's surface with the deionized water, then the electrolyzed water, and then the deionized water effects cleansing of the plastic's surface to a predetermined cleanliness value.

2. The method as claimed in claim 1, wherein the anodic water has a pH of less than 7.

3. The method as claimed in claim 1, wherein the cathodic water has a pH of greater than 7.

4. The method as claimed in claim 1 further comprising adjusting a pH and/or a redox potential of the electrolyzed water to a predetermined value.

5. The method as claimed in claim 4, wherein in the step of adjusting the pH and/or the redox potential of the electrolyzed water, adjustment of the pH and/or the redox potential of the electrolyzed water is produced in an electrolysis cell which comprises two electrodes and into which water admixed with an electrolyte is introduced, and the pH and/or the redox potential of the electrolyzed water is adjusted by using a concentration of the electrolyte and/or an electrical current flowing between the two electrodes as control parameter(s).

6. The method as claimed in claim 1 wherein the rinsing of the plastic's surface in each of steps a), b), and c) lasts between 5 seconds and 600 seconds.

7. The method as claimed in claim 1 wherein the rinsing of the plastic's surface in each of steps a), b), and c) lasts for different durations.

8. The method as claimed in claim 1 wherein a temperature of the deionized water and/or of the electrolyzed water is between 10° C. and 70° C.

9. The method as is claimed in claim 6 wherein at least one of the rinsing of the plastic's surface in steps a), b), c) lasts between 15 and 90 seconds.

10. The method as claimed in claim 1 further comprising adjusting a pH and a redox potential of the electrolyzed water based on the metallic particulate contaminants such that each of the pH and the redox potential of the electrolyzed water is adjusted, independent of one another, to a respective predetermined value based on the metallic particulate contaminants.

* * * * *